United States Patent [19]

Ibuchi

[11] Patent Number: 4,990,953
[45] Date of Patent: Feb. 5, 1991

[54] COPYING APPARATUS

[75] Inventor: Yoshiaki Ibuchi, Nara, Japan

[73] Assignee: Sharp Kabushiki Kaisha, Osaka, Japan

[21] Appl. No.: 358,783

[22] Filed: May 26, 1989

[30] Foreign Application Priority Data

May 27, 1988 [JP] Japan .................. 63-130865
Jun. 3, 1988 [JP] Japan .................. 63-138099

[51] Int. Cl.⁵ ............................................ G03B 27/72
[52] U.S. Cl. ........................... 355/69; 355/214; 355/228
[58] Field of Search ............. 355/246, 233, 232, 204, 355/208, 228, 229, 30, 69, 214

[56] References Cited

U.S. PATENT DOCUMENTS

| 4,320,964 | 3/1982 | Ishida et al. | 355/69 |
| 4,399,209 | 8/1983 | Sanders et al. | |
| 4,540,279 | 9/1985 | Irie et al. | 355/69 |
| 4,542,985 | 9/1985 | Honma et al. | 355/69 |
| 4,619,520 | 10/1986 | Araya | 355/69 X |
| 4,624,560 | 11/1986 | Berry | |
| 4,714,945 | 12/1987 | Fujiwara et al. | 355/69 |

Primary Examiner—Fred L. Braun
Assistant Examiner—Sandra L. Hoffman
Attorney, Agent, or Firm—Irell & Manella

[57] ABSTRACT

A copying apparatus in which a light receiving sheet is used is provided with a density level setting switch for setting the density level of a copy image, and an illuminance controller for adjusting both the luminous intensity and scanning speed of an optical system, in accordance with the density level. A copying apparatus may be provided with an input switch for inputting the sensitivity of a light receiving sheet, and a controller for adjusting both the scanning speed of said optical system and the speed of the process for forming a copy image, in accordance with the sensitivity of the light receiving sheet.

5 Claims, 7 Drawing Sheets

COPYING APPARATUS

BACKGROUND OF THE INVENTION

1. Field of the Invention:

This invention relates to a copying apparatus, and more particularly to a copying apparatus in which an original is scanned by an optical system to produce a copy image on a light receiving sheet and the copy image is transferred onto an image receiving sheet.

2. Description of the Prior Art:

An image forming method using a light receiving sheet is disclosed in Japanese Laid-Open Patent Publication (Kokai) No. 58(1983)-88,739. In this method, a combination of a light receiving sheet coated with photosensitive microcapsules containing non-colored dye and a photohardening material in a rupturable capsule and an image receiving sheet coated with a developer material which colors the non-colored dye is employed. The light reflected from an image is projected onto the light receiving sheet to form a selectively hardened pattern thereon, then the image receiving sheet is placed over the light receiving sheet. Thereafter, the combination is applied with pressure to rupture the non-hardened microcapsules, thereby coloring the non-colored dye to develop a copy image on the image receiving sheet.

When a copy image is formed on an image receiving sheet by a copying apparatus using the above-mentioned method, the density of the copy image depends on the luminous intensity of the light source of the optical system, the scanning speed of the optical system, and the variation in the sensitivity of the light receiving sheet. In such a copying apparatus, the luminous intensity of the light source or the scanning speed of the optical system must be adjusted in order to obtain a copy image of the desired density. This may be accomplished by controlling a power source for the light source to adjust the luminous intensity of the light source, or by controlling the driving motor for the optical system to adjust the scanning speed, in accordance with the density level which has been set by an operator.

When the density of a copy image is adjusted only by increasing or decreasing the luminous intensity of the light source, the voltage applied to the lamp of the light source must be changed over an extremely wide range to cover all possible density levels of copy images which may be set by an operator, causing the change in the color temperature of the lamp. The above will raise a problem in that the spectral wavelength distribution changes so that the hue of a image of a color copy is different from that of the original image.

On the other hand, the copy magnification ratio is altered by the change of the scanning speed. When a copy apparatus is designed so as to adjust the density of a copy image only by changing the scanning speed, therefore, the control of the scanning speed must cover a very wide range of scanning speeds so that both the adjustment of the image density and that of the copy magnification ratio are conducted simultaneously, which causes a substantially large difference between the minimum and maximum scanning speeds. This causes another problem to arise in that it is very difficult to control the driving motor of the optical system.

The sensitivity of a light receiving sheet depends upon the sensitivity of the photosensitive microcapsules which are scattered over a substantially wide range. When the sensitivity of the photosensitive microcapsules used in a light receiving sheet is low, hence, the apparatus is controlled so as to increase the luminous intensity of the light source. In contrast, when the sensitivity of the photosensitive microcapsules is high, the apparatus is controlled so as to decrease the luminous intensity of the light source. Namely, in a prior art copying apparatus, the unevenness of the sensitivity among light receiving sheets of different kinds is compensated by adjusting the luminous intensity of the light source. Therefore, the scanning speed in a prior art copying apparatus must be low, even when a light receiving sheet coated by photosensitive microcapsules of a high sensitivity is used, causing a prolonged period of time for the copying operation.

SUMMARY OF THE INVENTION

The copying apparatus of this invention, which overcomes the above-discussed and numerous other disadvantages and deficiencies of the prior art, and in which an original is scanned by an optical system to form a copy image on a light receiving sheet, and the copy image is transferred on an image receiving sheet, comprises: a density level setting means for setting the density level of the copy image; and an illuminance adjusting means for adjusting both the luminous intensity and scanning speed of said optical system, in accordance with the density level.

The copying apparatus of the invention may comprise: an input means for inputting the sensitivity of said light receiving sheet; and an adjusting means for adjusting both the scanning speed of said optical system and the speed of the process for forming the copy image, in accordance with the sensitivity of said light receiving sheet.

In a preferred embodiment, the apparatus further comprises an input means for inputting the luminous intensity of said optical system, and said adjusting means adjusts the scanning speed of said optical system and the speed of the process for forming the copy image in accordance with the sensitivity of said light receiving sheet and also with the luminous intensity.

Thus, the invention described herein makes possible the objectives of:

(1) to provide a copying apparatus in which the image density can be changed over a wide range even when the range of adjusting the luminous intensity of the light source and/or the range of adjusting the scanning speed are narrow;

(2) to provide a copying apparatus in which the optical scanner can be easily controlled;

(3) to provide a copying apparatus in which the copy operation can be conducted rapidly when a light receiving sheet coated by photosensitive microcapsules of a high sensitivity is used.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
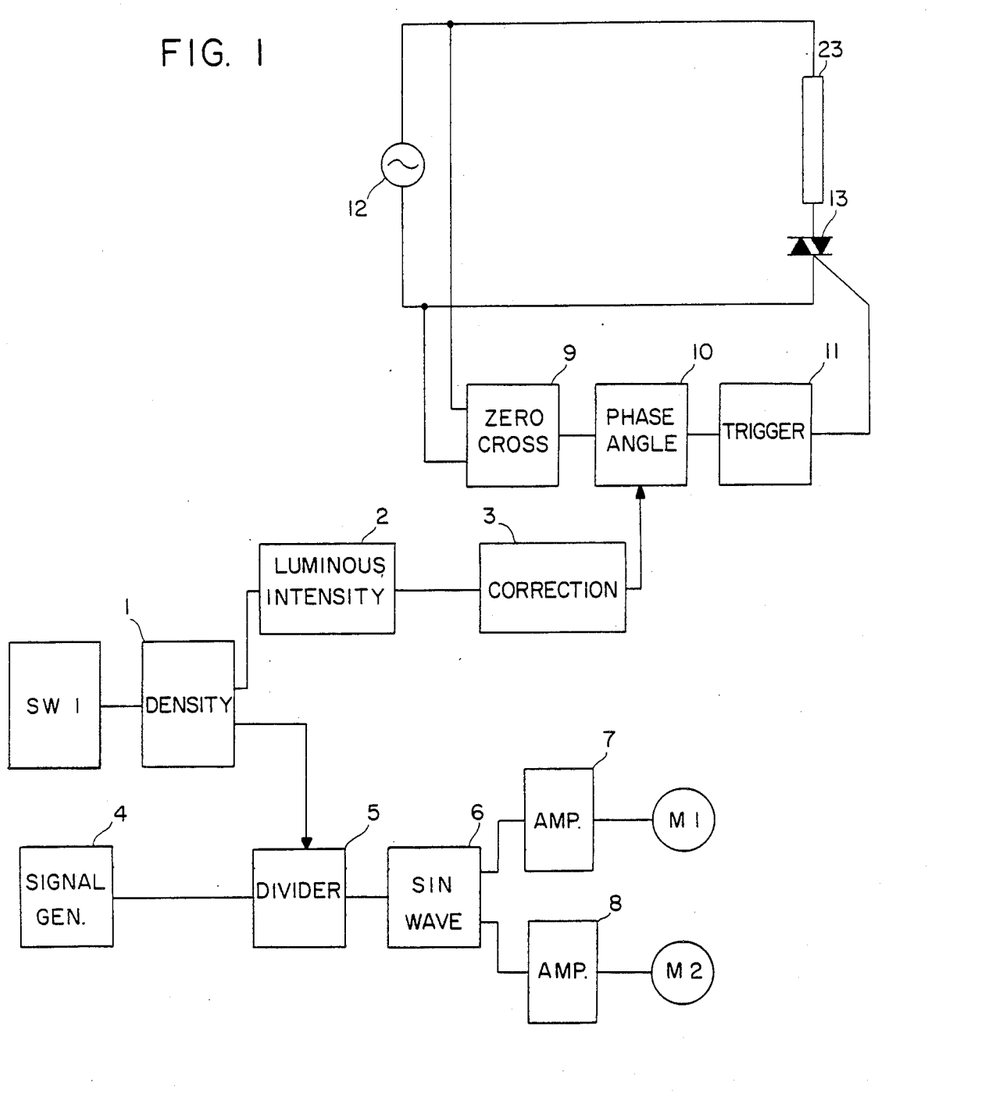
FIG. 1 is a block diagram of a copying apparatus of the invention.
Figure 2:
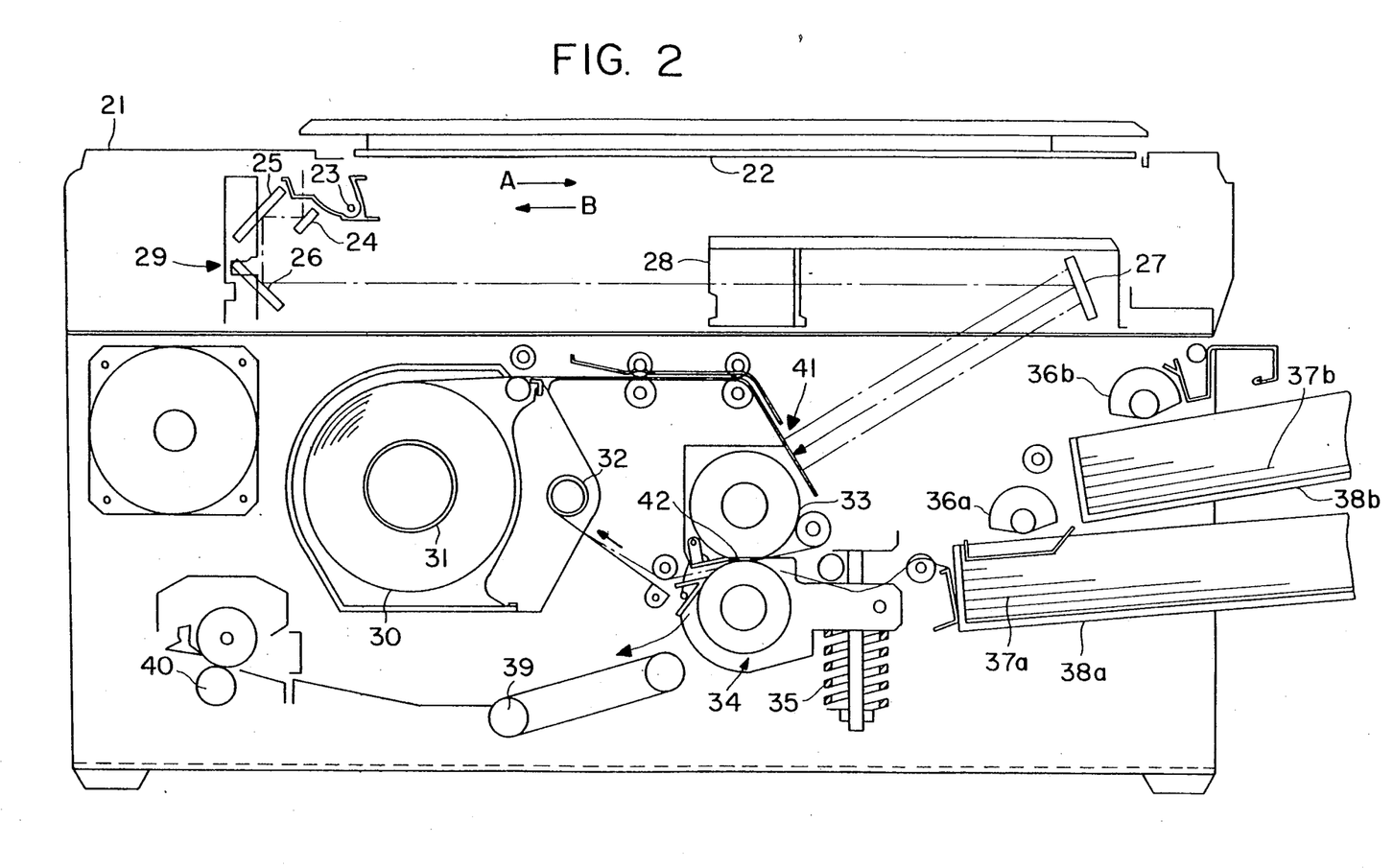
FIG. 2 shows a cross section of the copying apparatus of FIG. 1.

FIG. 1 is a block diagram of a copying apparatus according to the invention. FIG. 2 shows a cross section of the apparatus of FIG. 1. An original table 22 formed by a hard transparent glass is provided on the top of the body 21 of the apparatus. An optical system 29 is disposed under the original table 22. The optical system 29 comprises a light source or lamp 23, mirrors 24-27, and a lens 28. The lamp 23 and mirrors 24-27 move under the original table 22 in both directions indicated by arrows A and B to scan the image of an original placed on the original table 22. In the middle of the interior of the body 21, a pair of rollers 33 and 34 is disposed to form a pressure section 42. The lower roller 34 is pushed toward the upper roller 33 to contact it, by the resilient force of a spring 35. The rollers 33 and 34 contact with each other with the line pressure of 70 to 100 kg/cm.

A light receiving sheet 30 is wound on a feed shaft 31 disposed at the left of the rollers 33 and 34. The light receiving sheet 30 is fed to a take-up shaft 32 to be wound thereon, through an exposure section 41. In the right side panel of the body 21, installed are paper cassettes 38a and 38b for accommodating image receiving sheets 37a and 37b of different sizes. The image receiving sheet 37a or 37b is fed one by one by a paper feed roller 36a or 36b to the pressure section 42, so that both the image receiving sheet 37a or 37b and the light receiving sheet 30 pass together the pressure section 42. After passing the pressure section 42, the image receiving sheet 37a or 37b is conveyed on a transfer belt 39 to a heat roller 40. The surface of the image receiving sheets 37a and 37b on which an copy image is to be formed is previously coated with a thermoplastic resin in addition to a developer material. The thermoplastic resin is melted by the heat roller 40 to put a gloss to the image. After passing the heat roller 40, the image receiving sheet 37a or 37b exits from the apparatus.

As shown in FIG. 1, the lamp 23 of the optical system 29 is powered by an AC power source 12. The luminous intensity of the lamp source 23 is adjusted by controlling the conduction angle of a thyristor 13. When the output voltage of the AC power source 12 crosses 0V, a zero cross detecting circuit 9 outputs a zero cross signal to activate a phase angle setting circuit 10 which outputs a phase angle setting pulse having a variable width. The phase angle setting pulse is supplied to a trigger circuit 11 which produces a pulse signal at the rising of the phase angle setting pulse. The pulse signal is supplied to the thyristor 13 to set the conduction angle.

The operator inputs the desired image intensity through a density selection switch SW1 disposed on an operation panel (not shown) on the top of the body 21. In response to the operation of the density selection switch SW1, a density signal generating circuit 1 supplies a density level signal to a luminous intensity circuit 2 and a frequency divider or dividing circuit 5. The luminous intensity circuit 2 sets the luminous intensity in accordance with the density level signal. According to the thus decided luminous intensity, a control signal is supplied from a correction circuit 3 to the phase angle setting circuit 10.

The dividing circuit 5 receives a reference signal from a reference signal generating circuit 4, and divides the reference signal by a dividing ratio according to the density level signal from the density signal generating circuit 1. The divided pulse output from the dividing circuit 5 is input into a sinusoidal wave circuit 6 which generates a sinusoidal wave signal corresponding to the pulse width of the dividing pulse. The sinusoidal wave signal is supplied to amplifiers 7 and 8. The outputs of the amplifiers 7 and 8 are delivered to synchronous motors M1 and M2, respectively. The motor M1 drives the optical system 29, and the motor M2 rotates the take-up shaft 32.

In the apparatus having the above-mentioned structure, the density selection switch SW1 functions as a density level selecting means, and the combination of the density signal generating circuit 1, luminous intensity circuit 2 and correction circuit 3 functions as an illuminance adjusting means.

Figure 3:
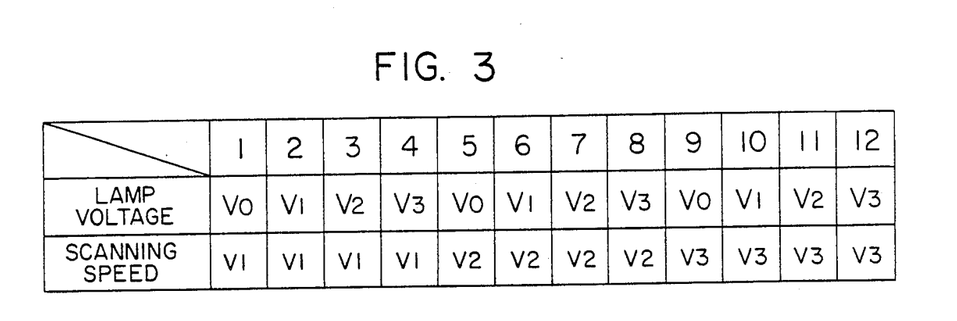
FIG. 3 is a table showing the relation between the lamp voltage and the scanning speed in the copying apparatus of FIG. 1.
Figure 4:
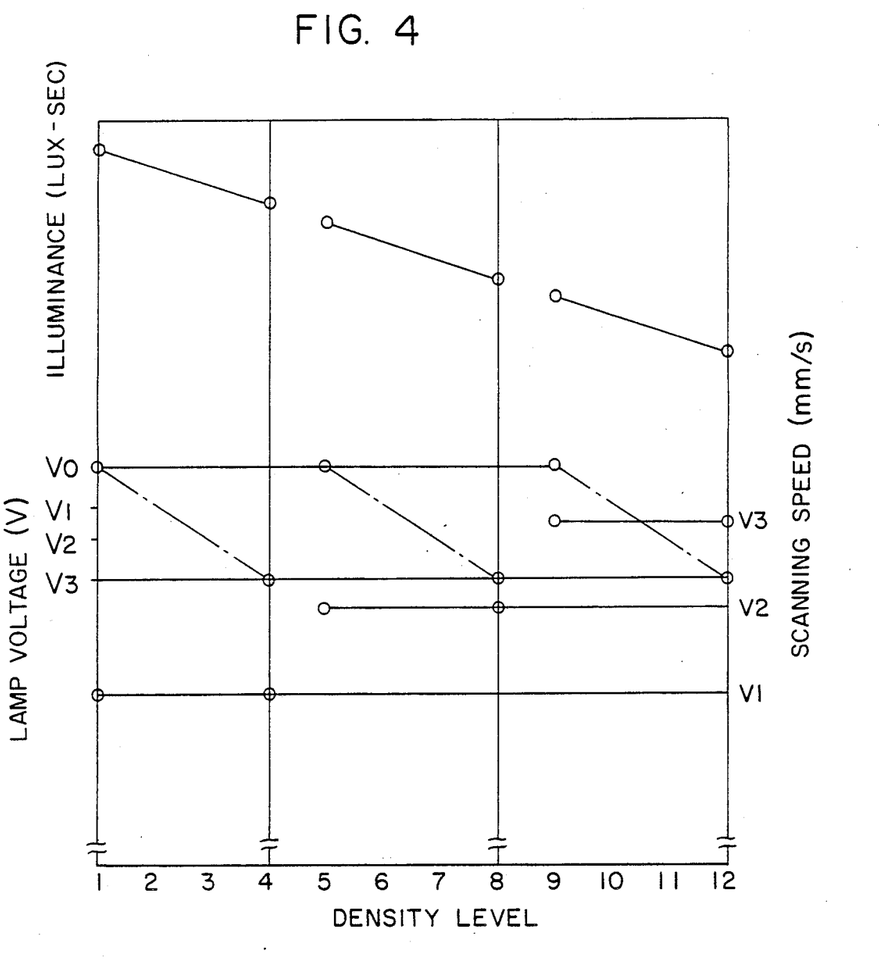
FIG. 4 is a graph showing the relation between the density levels and the illuminance, lamp voltage and scanning speed in the copying apparatus of FIG. 1.

In accordance with the density level set through the density selection switch SW1, the voltage applied to the lamp 23 and the scanning speed are set as shown in FIGS. 3 and 4. By operating the density selection switch SW1, the density level can be set at one of the settings 1-12 (FIG. 3). As the figure of the density level increases, the image density becomes darker. The scanning speed of the optical system 29 changes in three steps of speed $V_1$, $V_2$ and $V_3$ for each density level range of 1-4, 5-8 and 9-12, where $v_1 > v_2 > v_3$. Accordingly, as the figure of the density level is increased to make the image density darker, the scanning speed increases in three steps.

The voltage applied to the lamp 23 changes from $V_0$ to $V_3$ ($V_3 > V_2 > V_1 > V_0$) for each density level range of 1-4, 5-8 and 9-12. As the figure of the density level increases in each density level range of 1-4, 5-8 and 9-12, the voltage applied to the lamp 23 decreases. For example, when the density level is set at 7, the voltage $V_2$ is applied to the lamp 23, and the optical system 29 scans the original at the speed $v_2$.

By changing the voltage applied to the lamp 23 and also the scanning speed of the optical system 29 in accordance with the density level set by the density selection switch SW1, it is possible to continuously change the illuminance of the original placed on the original table 22, as shown in FIG. 4. In this embodiment, although the voltage applied to the lamp 23 is adjustable in four steps of $V_0$ to $V_3$, and the scanning speed of the optical system 29 in three steps of $v_1$ to $v_3$, the illuminance can be changed continuously corresponding to the changes of the density levels in 12 steps. This allows the step widths of the voltage applied to the lamp 23 and of the scanning speed of the optical system 29 to be made smaller. Hence, it is possible to prevent the change of a substantial degree in the color temperature of the lamp 23 from occurring, permitting the density level to be changed without causing substantial changes in the hue in the copy image. Moreover, it is not required to change the speed of the motor for driving the optical system 29 over a wide range, so that the control of the driving motor can be performed easily.

In the above-described embodiment, the scanning speed is adjustable in three steps for each density level range of 1-4, 5-8 and 9-12, while the lamp voltage is adjustable in four steps for each range. The manner of changing the scanning speed and the voltage applied to the light source may be adequately modified to comply with the required image quality.

Figure 5:
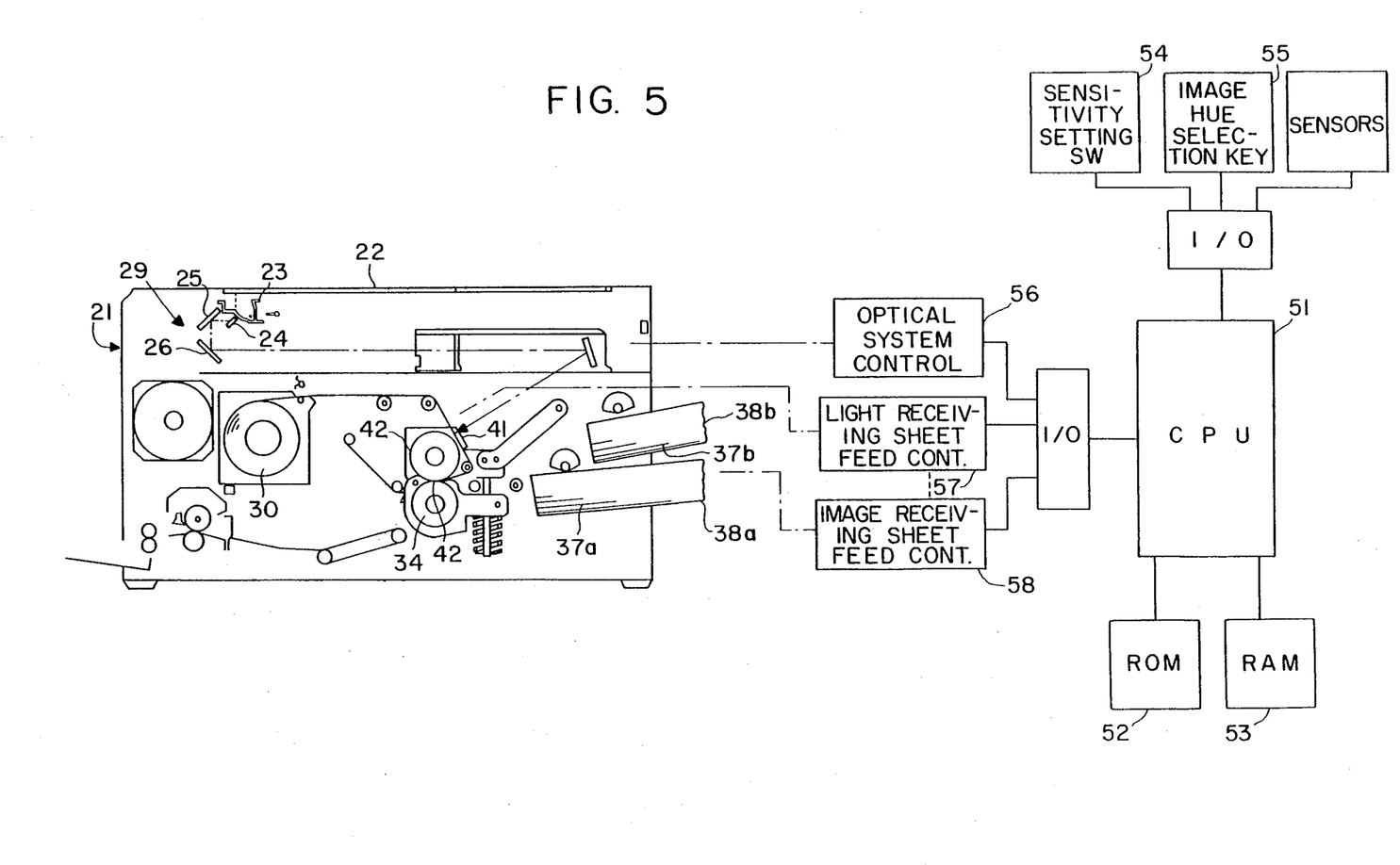
FIG. 5 shows another copying apparatus of the invention.

FIG. 5 illustrates another copying apparatus according to the invention. The apparatus of FIG. 5 is controlled by a CPU 51 to which a ROM 52 and a RAM 53 are connected. The ROM 52 stores programs for performing the control. The RAM 53 stores values of the luminous intensity, the scanning speed, and the conveying speed of a light receiving sheet 30 (the speed of transferring a copy image). In response to inputs from a sensitivity setting switch 54, an image hue selection key 55 and the like, the CPU 51 outputs control signals to an optical system control unit 56, a light receiving sheet convey control unit 57 and an image receiving sheet convey control unit 58. The optical system control unit 56 controls the voltage applied to the lamp 23, and also the moving speed of the mirrors 24-27 (i.e., the speed of scanning an original). The light receiving sheet feed control unit 57 controls the speed of feeding out the light receiving sheet 30. The image receiving sheet feed control unit 58 controls the timing of feeding the image receiving sheet 37a or 37b from the cassette 38a or 38b to the pressure section 42.

By operating the sensitivity setting switch 54 which is disposed on the body 21 in the vicinity of the cassettes 38a and 38b, the sensitivity properties of microcapsules are input into the CPU 51. The sensitivity properties to be input include the sensitivity based on the kind of the light receiving sheet, and the sensitivity based on the manufacturing lot of the light receiving sheet. Preferably, these sensitivity properties are previously written on each cassette 38a or 38b so that the operator can input these values while reading the description on the cassette, to facilitate the input operation of these properties. The desired degree of the hue of a copy image is input through the image hue selection key 55 disposed in the operation panel.

Figure 8:
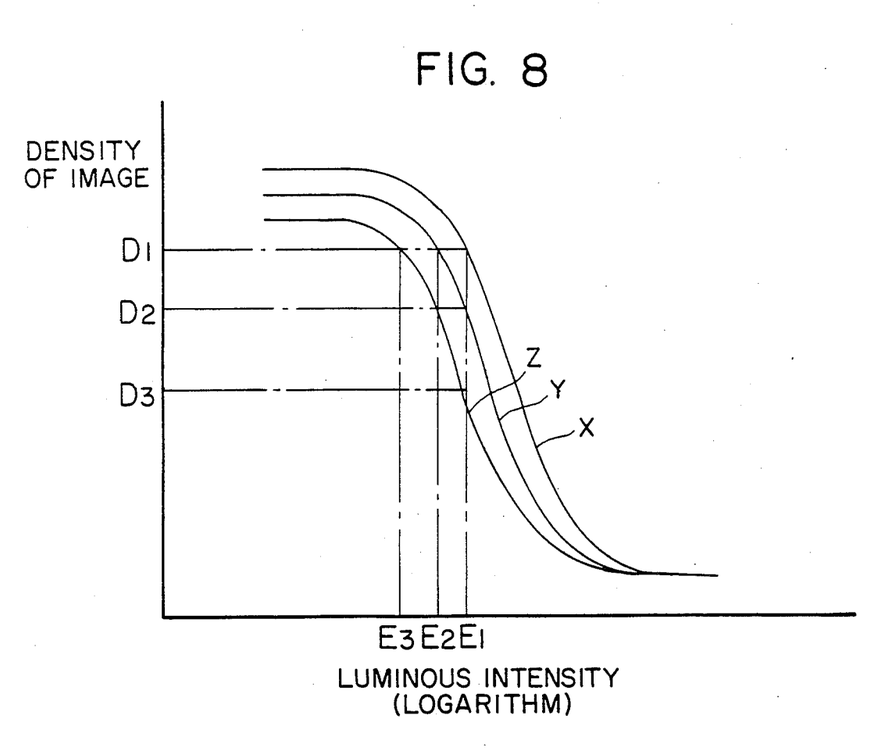
FIG. 8 is a graph showing the relation between the luminous intensity and the image density in various light receiving sheets.

FIG. 8 shows the sensitivity properties of light receiving sheets X, Y and Z which are the same in kind but the manufacturing lots of which are different from each other. The axis of abscissas indicates the luminous intensity against the gray scale density, and the axis of ordinates indicates the density of a copy image. For the sake of simplicity, an image which is formed using a light receiving sheet is referred hereinafter as "an image on a light receiving sheet".

Among the light receiving sheets X, Y and Z, the sheet X has the lowest sensitivity. When images are formed using these sheets under the same conditions, therefore, the image on the sheet X is deepest (darkest), and the image on the sheet Z is palest (brightest). More specifically, from the gray scale density in which the luminous intensity $E_1$ is reflected, an image of the density $D_1$ is formed on the sheet X, an image of the density $D_2$ is formed on the sheet Y, and an image of the density $D_3$ is formed on the sheet Z. In order to obtain images of the same hue on sheets of different manufacturing lots, it is required to set the luminous intensity in accordance with the sensitivity properties of the light receiving sheet. Namely, the luminous intensity when using the sheet Y and Z is adjusted so that the hues of images on the sheet Y and Z become the same as the hue of the image on the sheet X.

When the sheet X is used and the luminance intensity is $E_1$, the obtained image has the density $D_1$. When the sheet Z is used, the luminance intensity is set to $E_3$ so that the degree of the hardening of the microcapsules is reduced by the amount corresponding to $D_1-D_3$ in terms of the image density, resulting in obtaining an image of the density $D_1$. When the sheet Y is used, the luminance intensity is set to $E_2$ so that the degree of the hardening of the microcapsules is reduced by the amount corresponding to $D_1-D_2$ in terms of the image density, resulting in obtaining an image of the density $D_1$. By setting the luminance intensity in this way, it becomes possible to make the hues of images equal to each other even when light receiving sheets of different manufacturing lots are used.

In this embodiment, the luminance intensity can be adjusted by changing the speed of scanning an original on the original table 22 and by changing the speed of the process for forming an image such as the speed of conveying a light receiving sheet and the timing of delivering an image receiving sheet.

Figure 9:
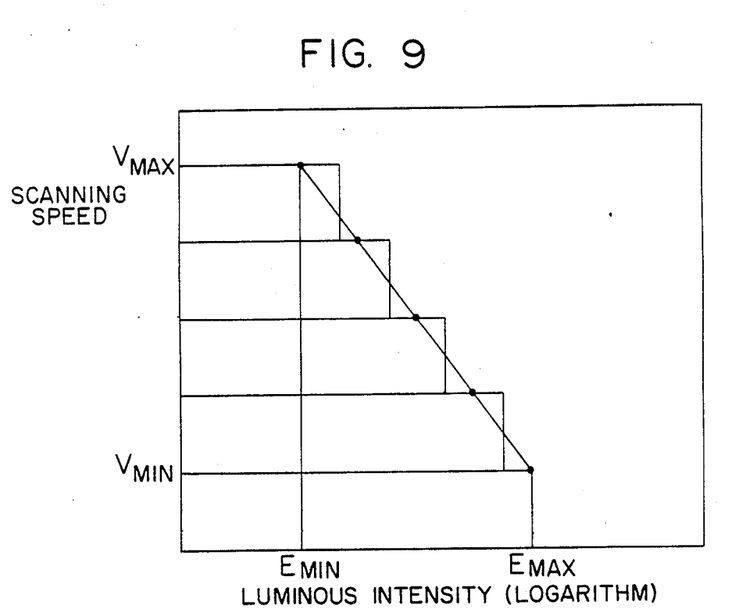
FIG. 9 is a graph showing the relation between the luminous intensity and the scanning speed in the copying apparatus of FIG. 5.

FIG. 9 illustrates the relation between the speed of scanning an original and the luminance intensity in an optical system. When the speed of scanning an original is selected within the range of $V_{max}$ to $V_{min}$, the luminance intensity changes continuously in the range of $E_{min}$ to $E_{max}$. In practical use, however, it is not necessary to continuously set the speed of scanning an original (i.e., the luminance intensity), and the adjustment in several steps (e.g., five steps as shown in FIG. 9) is sufficient for setting the luminance intensity according to the manufacturing lot of the light receiving sheet to be used, to obtain copy images of the same hue when light receiving sheets of different manufacturing lots are used. When a copy in the actual size is to be conducted, the speed of the process for forming a copy image is set to be substantially the same as the speed of scanning an original. When a magnification or reduction copy process is to be conducted, the speed of the process for forming a copy image is set to be higher or lower according to the degree of magnification or reduction.

The difference in sensitivities of light receiving sheets is caused not only by the difference in manufacturing lots but also by the difference owing to the variation in kinds. The kind of a light receiving sheet depends on the kind of the photohardening material enclosed in the photosensitive microcapsules. The difference in sensitivities caused by the variation in kinds of light receiving sheets can be compensated by adequately setting the speed of scanning an original in the same manner as for the difference caused by manufacturing lots, so as to obtain copy images of uniform hues. When the sensitivity of a light receiving sheet deviates from a mean value, for example, the luminance intensity is set in accordance with the degree of the deviation, and the speed of canning an original is set so as to comply with this luminance intensity.

A light receiving sheet on which various kinds of photosensitive microcapsules are dispersed is often used. For example, a light receiving sheet for a color copy has three kinds of microcapsules. When using such a light receiving sheet, it is necessary to compensate the difference caused by the variation in the sensitivities of the microcapsules, in addition to the differences caused by the variation in kinds and manufacturing lots of light receiving sheets. The difference of sensitivity in one light receiving sheet can be compensated by inserting a filter means for color correction in the path of the light reflected from an original.

Figure 7:
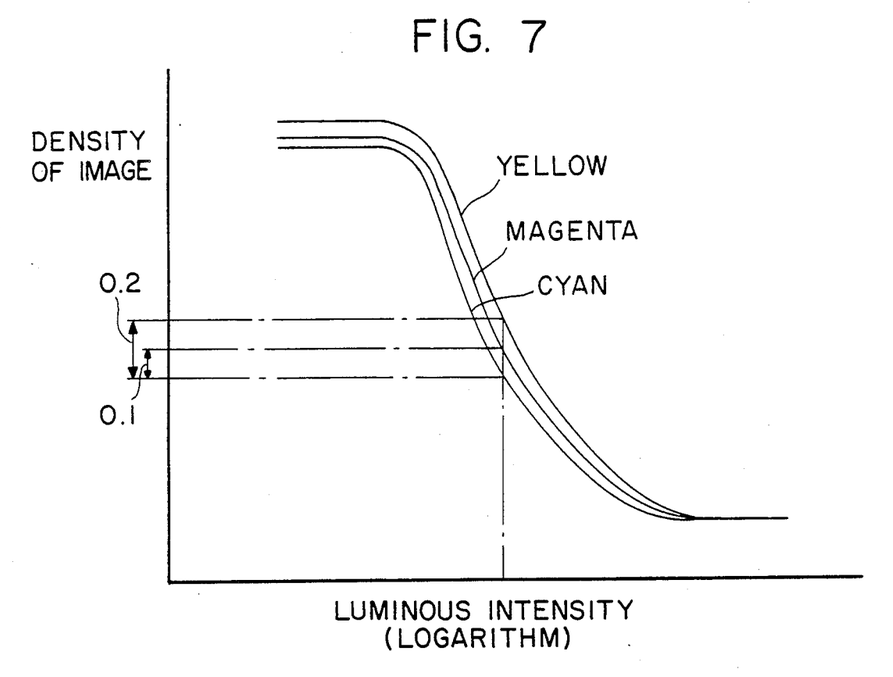
FIG. 7 is a graph showing the relation between the luminous intensity and the image density in various microcapsules.

FIG. 7 illustrates sensitive properties of a light receiving sheet for a color copy. The light receiving sheet is uniformly coated with three kinds of microcapsules, Y capsules, M capsules and C capsules. The Y capsules contain a photohardening material which is sensitive to light of the wavelength of the blue region, and non-colored dye which will be colored yellow. The M capsules contain a photohardening material which is sensitive to light of the wavelength of the green region, and non-colored dye which will be colored magenta. The C capsules contain a photohardening material which is sensitive to light of the wavelength of the red region, and non-colored dye which will be colored cyan. FIG. 7 shows densities of copy images formed on the light receiving sheet by irradiating thereon light reflected from a gray scale. The axis of abscissas indicates the luminous intensity against the gray scale density, and the axis of ordinates indicates the density of a copy image. As seen from FIG. 7, the Y capsules are low in sensitivity compared with the M and C capsules. If the luminance intensity is set so that the density of a copy image formed by the Y capsules becomes proper, a copy image formed by the M capsules becomes darker by 0.1 density levels, and that formed by the C capsules darker by 0.2 density levels. This problem can be solved by placing a yellow, magenta or cyan filter(s) in the path of the light reflected from an original. Because the sensitivity properties of a light receiving sheet vary depending upon the kind of Y, M and C capsules used therein, the kinds of filters are changed according to the kinds of the light receiving sheet to be used. Accordingly, a copy image of further improved qualities can be obtained by conducting the compensation of the variation in sensitivity properties of photosensitive microcapsules (i.e., the use of color correction filters), in addition to the compensation of the variation in sensitivity properties due to the kinds and manufacturing lots of light receiving sheets to be used.

Figure 6:
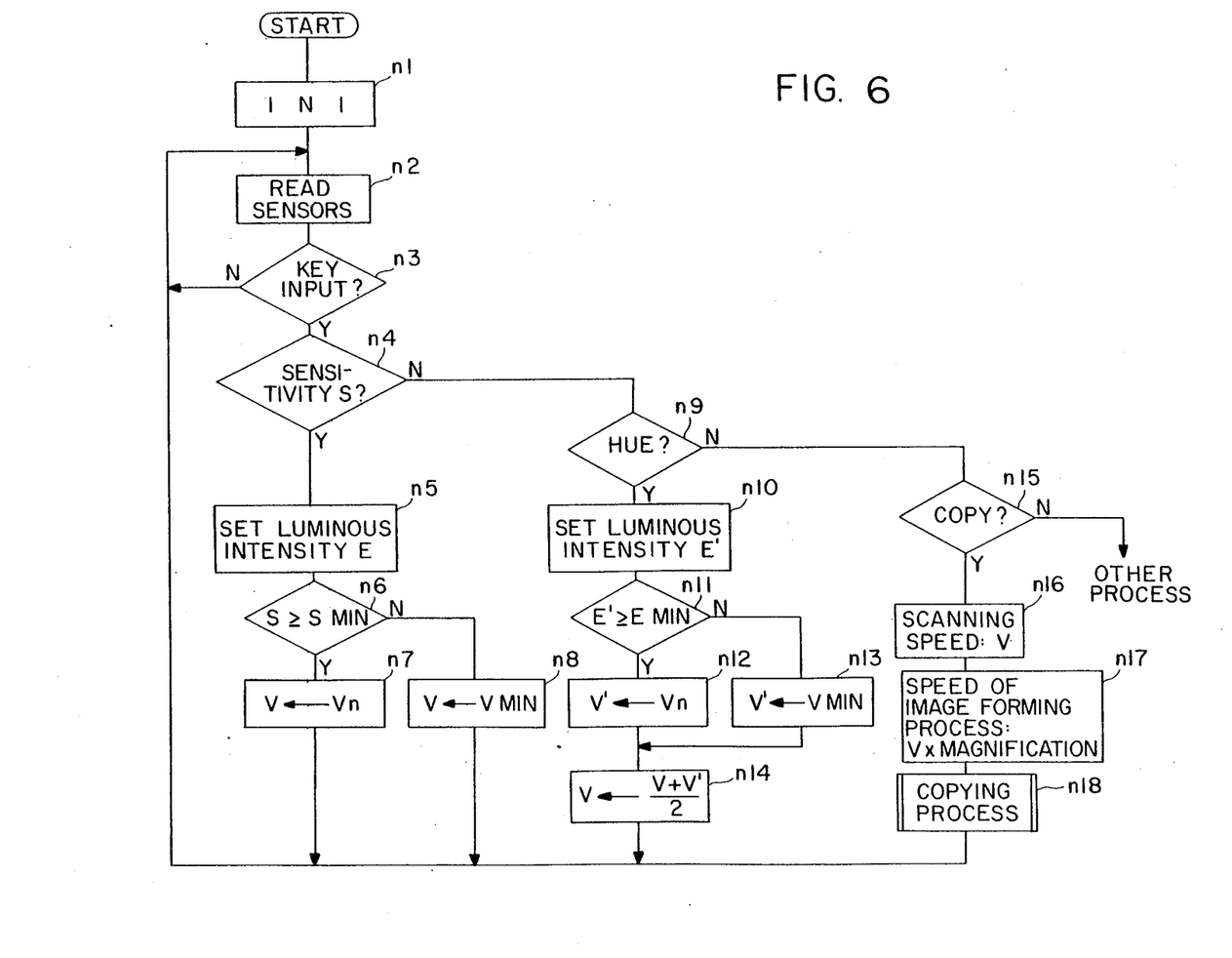
FIG. 6 is a flowchart of the operation of the copying apparatus of FIG. 5.

A flowchart of the operation of the apparatus of FIG. 5 is shown in FIG. 6. When the apparatus is powered on, each unit in the apparatus is initialized and warmed up (step n1), and then the system reads sensors and waits a key operation (steps n2 and n3). If the sensitivity setting switch 54 is operated to input the sensitivity S of the light receiving sheet to be used (step n4), the luminous intensity E is set in accordance with the sensitivity S (step n5). When the sensitivity S is less than the minimum sensitivity $S_{min}$ which is previously set, the minimum speed $V_{min}$ which is also previously set is set as the scanning speed V (steps n6 and n8). When the sensitivity S is not less than the minimum sensitivity $S_{min}$, the scanning speed V is set to the value corresponding to the sensitivity S (steps n6 and n7). Thereafter, the system returns to step n2, and waits a further key operation.

If the image hue selection key 55 is operated to input the desired hue, the luminous intensity E' is set in accordance with the degree of the desired hue (steps n9 and n10). When the luminous intensity E' is less than the minimum luminous intensity $E_{min}$, the minimum speed $V_{min}$ is set as the scanning speed V' (steps n11 and n13). When the luminous intensity E' is not less than the minimum speed $V_{min}$, the scanning speed V' is set to the value corresponding to the luminous intensity E' (steps n11 and n12). In step n14, the scanning speed V is corrected so as to be the arithmatic mean of the scanning speed V obtained in step n7 or n8 (the speed corresponding to the sensitivity S) and the scanning speed V' obtained in step n12 or n13 (the speed corresponding to the desired hue).

When a switch for initiating the copying process is pressed (step n15), the scanning speed is finally set (step n16) to either of the scanning speed V obtained in step n7 or n8 (the speed corresponding to the sensitivity S) and the scanning speed V obtained in step n14 (the speed corresponding to the sensitivity S and the desired hue). In step n17, the speed of the image forming process is obtained by multiplying the scanning speed V obtained in step n16 by the magnification ratio. The copying process is performed under the thus-obtained scanning speed V and speed of image forming process (step n18).

As described above, the copying apparatus of FIG. 5 can produce a copy image of an adequate hue regardless of the kind or manufacturing lot of the light receiving sheet, thereby enabling the operator to set desirably the hue of a copy image. When a light receiving sheet of a high sensitivity is used, therefore, the scanning speed and/or the speed of image forming process can be set to a higher value, resulting in the reduced period of time required for a copy process.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a copying apparatus in which an original is scanned by an optical system to form a copy image on a light receiving sheet, and the copy image is transferred on an image receiving sheet, said apparatus comprises:
   a density level setting means for setting the density level of the copy image; and
   an illuminance adjusting means for adjusting both the luminous intensity and scanning speed of said optical system, in accordance with the density level,
   further comprising an input means for inputting the luminous intensity of said optical system, and said adjusting means adjusts the scanning speed of said optical system and the speed of the process for forming the copy image in accordance with the sensitivity of said light receiving sheet and also with the luminous intensity.

2. In a copying apparatus in which an original is scanned by an optical system to form a copy image on a light receiving sheet, and the copy image is transferred on an image receiving sheet, said apparatus comprises:

an input means for inputting the sensitivity of said light receiving sheet; and an adjusting means for adjusting both the scanning speed of said optical system and the speed of the process for forming the copy image, in accordance with the sensitivity of said light receiving sheet, further comprising an input means for inputting the luminous intensity of said optical system, and said adjusting means adjusts the scanning speed of said optical system and the speed of the process for forming the copy image in accordance with the sensitivity of said light receiving sheet and also with the luminous intensity.

3. In a copying apparatus in which an original is scanned by an optical system to form a copy image on a light receiving medium, and the copy image is transferred on an image receiving medium, said apparatus comprises:

an exposure means for exposing the original, said exposure means being contained in said optical system;

a density level setting means for setting a density level of the copy image formed on the image receiving medium;

a first moving means for moving the light receiving medium;

a second moving means for moving the optical system; and an adjusting means for adjusting the luminous intensity of said exposure means, moving speed of the optical system and moving speed of the light receiving medium, in accordance with the density level set by said setting means.

4. A copying apparatus according to claim 3, wherein said density level setting means selects the density level from a plurality of setting level groups each consisting of a plurality of setting levels, said adjusting means adjusts said luminous intensity in accordance with the setting level in each of the setting level groups, sets said scanning speed which is common to the setting levels in the same setting level group, in accordance with the setting level groups, and changes said moving speed of said light receiving medium in accordance with magnification rate.

5. In a copying apparatus in which an original is scanned by an optical system to form a copy image on a light receiving medium, and the copy image is transferred on an image receiving medium, said apparatus comprises:

an exposure means for exposing the original, said exposure means being contained in said optical system;

an input means for inputting a sensitivity of said light receiving medium;

a first moving means for moving the light receiving medium;

a second moving means for moving the optical system; and an adjusting means for adjusting the luminous intensity of said exposure means, moving speed of the optical system and moving speed of the light receiving medium, in accordance with the sensitivity of the light receiving medium inputted by said input means.

* * * * *